US010528141B2

(12) United States Patent
Weissl et al.

(10) Patent No.: US 10,528,141 B2
(45) Date of Patent: Jan. 7, 2020

(54) REMOTE CONTROL WITH RETAINING RING

(71) Applicant: fm marketing gmbh, Neumarkt am Wallersee (AT)

(72) Inventors: Christian Weissl, Köstendorf (AT); Ferdinand Maier, Neumarkt am Wallersee (AT)

(73) Assignee: fm marketing gmbh, Neumarkt am Wallersee (AT)

( * ) Notice: Subject to any disclaimer, the term of this patent is extended or adjusted under 35 U.S.C. 154(b) by 0 days.

(21) Appl. No.: 16/161,843

(22) Filed: Oct. 16, 2018

(65) Prior Publication Data
US 2019/0113976 A1 Apr. 18, 2019

(30) Foreign Application Priority Data
Oct. 16, 2017 (DE) .................. 10 2017 124 045

(51) Int. Cl.
| G08B 6/00 | (2006.01) |
| G06F 3/01 | (2006.01) |
| H03K 17/97 | (2006.01) |
| G06F 3/0362 | (2013.01) |
| G06F 3/0485 | (2013.01) |

(52) U.S. Cl.
CPC ............ G06F 3/016 (2013.01); G06F 3/0362 (2013.01); G06F 3/0485 (2013.01); H03K 17/97 (2013.01); H03K 2217/96062 (2013.01)

(58) Field of Classification Search
CPC ...... G06F 3/016; G06F 3/0485; G06F 3/0362; H03K 17/97; H03K 2217/96062; H05K 3/301; H05K 2201/10053; H01H 25/04

USPC .................. 340/407.2, 407.1; 455/550, 575; 200/5 A

See application file for complete search history.

(56) References Cited

U.S. PATENT DOCUMENTS

| 3,952,612 A * | 4/1976 | Kurkowski ............. F16F 15/36 74/570.21 |
| 8,643,480 B2 | 2/2014 | Maier |
| 2005/0274591 A1 * | 12/2005 | Kim ....................... B60K 37/06 200/61.54 |
| 2008/0224996 A1 * | 9/2008 | Arihara ................. G06F 3/0362 345/157 |
| 2011/0120849 A1 * | 5/2011 | Morimoto ............. G06F 3/0338 200/5 A |
| 2012/0072150 A1 * | 3/2012 | Furukawa ................ G01B 7/00 702/65 |
| 2018/0011509 A1 | 1/2018 | Maier et al. |
| 2018/0337675 A1 | 11/2018 | Maier |

FOREIGN PATENT DOCUMENTS

DE      102010019596 A1    11/2011

* cited by examiner

*Primary Examiner* — Anh V La
(74) *Attorney, Agent, or Firm* — Stinson LLP

(57) ABSTRACT

A remote control having a circuit board to which a guide disc with protruding locking pins is are attached. The locking pins protrude through openings of the circuit board to an opposite side and have radial locking protrusions. A locking ring with recesses on the second side of the circuit board engages the locking pins, and thus fixes the locking ring, causing the discs lying on both sides of the circuit board to be fixed on the circuit board.

17 Claims, 5 Drawing Sheets

REMOTE CONTROL WITH RETAINING RING

REFERENCE TO RELATED APPLICATION

This is a US application claiming priority to German application DE10 2017 124 045.4 filed on Oct. 16, 2017, the entire disclosure of which is expressly incorporated herein by reference.

FIELD OF THE INVENTION

The invention relates to a remote control.

BACKGROUND

DE 10 2015 119 485 A1 describes a remote control with magnets comprising a pushbutton that can be pressed by a user to input information in that the user applies a pressure in a pressure application direction; a sensor magnet arranged on the underside of the pushbutton when viewed in the pressure application direction; and an armature magnet arranged below the pushbutton when viewed in the pressure application direction, and fixed relative to the pushbutton, wherein the magnetic poles of the sensor magnet and of the armature magnet are arranged in such a way that the pushbutton with the sensor magnet is pressed away from the armature magnet against the pressure application direction.

Remote controls in which magnets with haptically perceptible forces act on input elements such as keys are known, for instance, from DE 10 2011 014763 A1 and DE 10 2010 019596 A1.

The older patent application DE 10 2016 112318 describes a remote control comprising a housing and a control ring, in which the control ring comprises several key areas radially offset from a centre, which can be pressed into the housing in a pressure direction relative to the housing. Several pins with thickened head are attached directly or indirectly to the control ring. A guide plate or guide disc which is fixed to the housing to guide the control ring in the pressure direction has bearing shells adapted to the thickened heads. Sections of the pins extend through openings of a circuit board, and the bearing shells and the thickened heads are designed as a limit stop for the control ring to move against the pressure application direction. The pins with thickened head are inserted into sleeves on the underside facing the circuit board, and are connected, for example, by gluing. The heads and bearing shells act as limit stop and also as centring devices to align the control ring. In the opposite direction, i.e. when the button is pressed by a user, the movement of the control ring in the pressure direction on the circuit board is limited in such a way that the underside of the control ring makes contact with the guide plate.

In order to achieve the said arrangement with the guide plate being attached to the circuit board, the guide plate can be screwed, glued or caulked to the circuit board or connected to it by any other known connection methods. In general, all known connection methods are rather complex and expensive in terms of producing the remote control.

SUMMARY OF THE INVENTION

Therefore, the object of the invention is to simplify the remote control production method mentioned at the outset, and at the same time maintain a good fixation of the guide plate or guide disc on the circuit board in the required position.

According to the invention, a remote control has a circuit board of common design with several openings. A guide disc or guide plate is attached to a first side of the circuit board, with protruding locking pins that protrude through openings of the circuit board towards their opposite side. The locking pins have radial locking protrusions. A locking ring with recesses is provided on the second side of the circuit board which can engage behind the thickened heads of the locking pins, and thus fix the locking ring, causing the discs lying on both sides of the circuit board to be fixed on the circuit board.

The locking pins have radial protrusions which extend only over a limited circumference of the locking pins, wherein each locking pin is preferably equipped with two protrusions, whose central axes are offset at 180° from each other.

In order to achieve the desired functions, the retaining ring or locking ring preferably has a circular form and is equipped with an approximately u-shaped guiding element for each locking pin, into which an assigned locking pin engages to fix the locking ring to the opposite disc on the circuit board by means of its radial protrusions.

For a well-tensioned fixation, the u-shaped, track-shaped guiding element of the locking ring has a chamfer on which an assigned radial protrusion of the locking pins engages.

Preferably, the remote control has four locking pins being arranged in such a way that they are offset by 90° at the circumference of the first disc.

It is also advantageous that one leg of the u-shaped guiding element is resiliently pre-stressed in the direction of the outer circumference of the locking ring. This ensures proper fixing and simple installation.

The circuit board has an opening for each locking pin which is adjusted to the shape of the locking pins with the radial protrusions.

It is also advantageous that the locking pins are hollow and cylindrical, and engage in cylindrical guide posts of the control ring, which act as a further guiding element.

Preferably, the guide disc and the locking ring are generally circular.

The invention is described in more detail in the following using an embodiment. It shows:

DETAILED DESCRIPTION OF PREFERRED EMBODIMENTS

Figure 3:
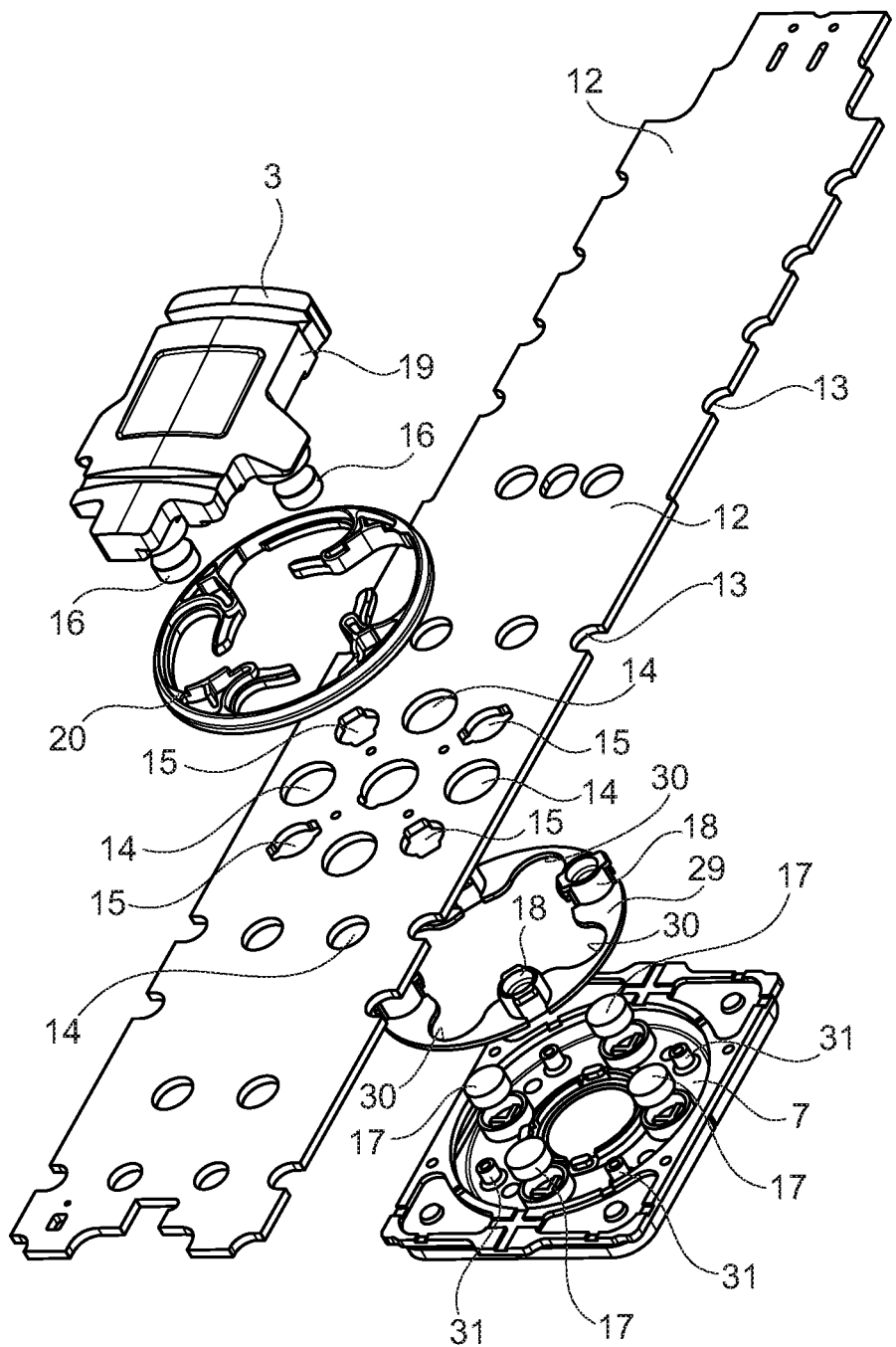
FIG. 3 is an exploded view similar to FIG. 2 when viewed in a second viewing direction

The remote control 1 comprises a housing comprising an upper casing 2 and a lower casing 3 (of which only a partial section is shown in FIG. 3), as well as a first keypad 4 with a plurality of pushbuttons 5, and a second keypad 6 with a plurality of pushbuttons 5. For the sake of clarity, not all pushbuttons 5 are given their own reference signs. Both keypads 4 and 6 are separated from one another by a control ring 7. The control ring 7 has four key areas 8, 9, 10 and 11, each at 90° to one another and mainly covering the area of a quadrant. The control ring 7 can be pressed in one of the key areas 8, 9, 10 or 11, causing certain commands for a device to be remotely controlled to be triggered. This means that four different commands can be triggered with the four key areas 8, 9, 10 or 11. Another number of distinguishable key areas may be provided, although for practical reasons not more than eight different key areas should be provided.

Figure 1:
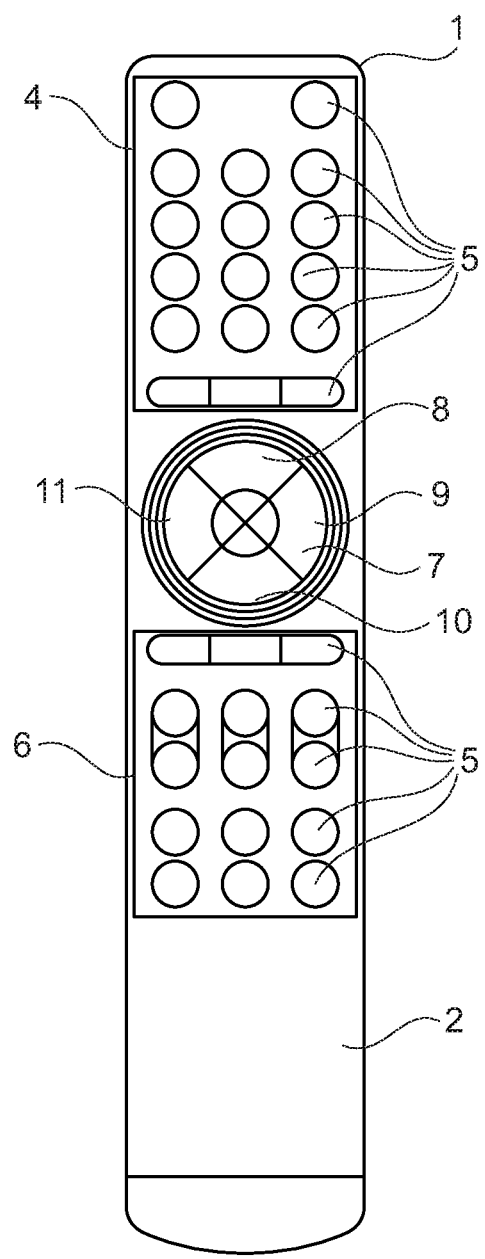
FIG. 1 is a plan view of a remote control according to the invention.
Figure 2:
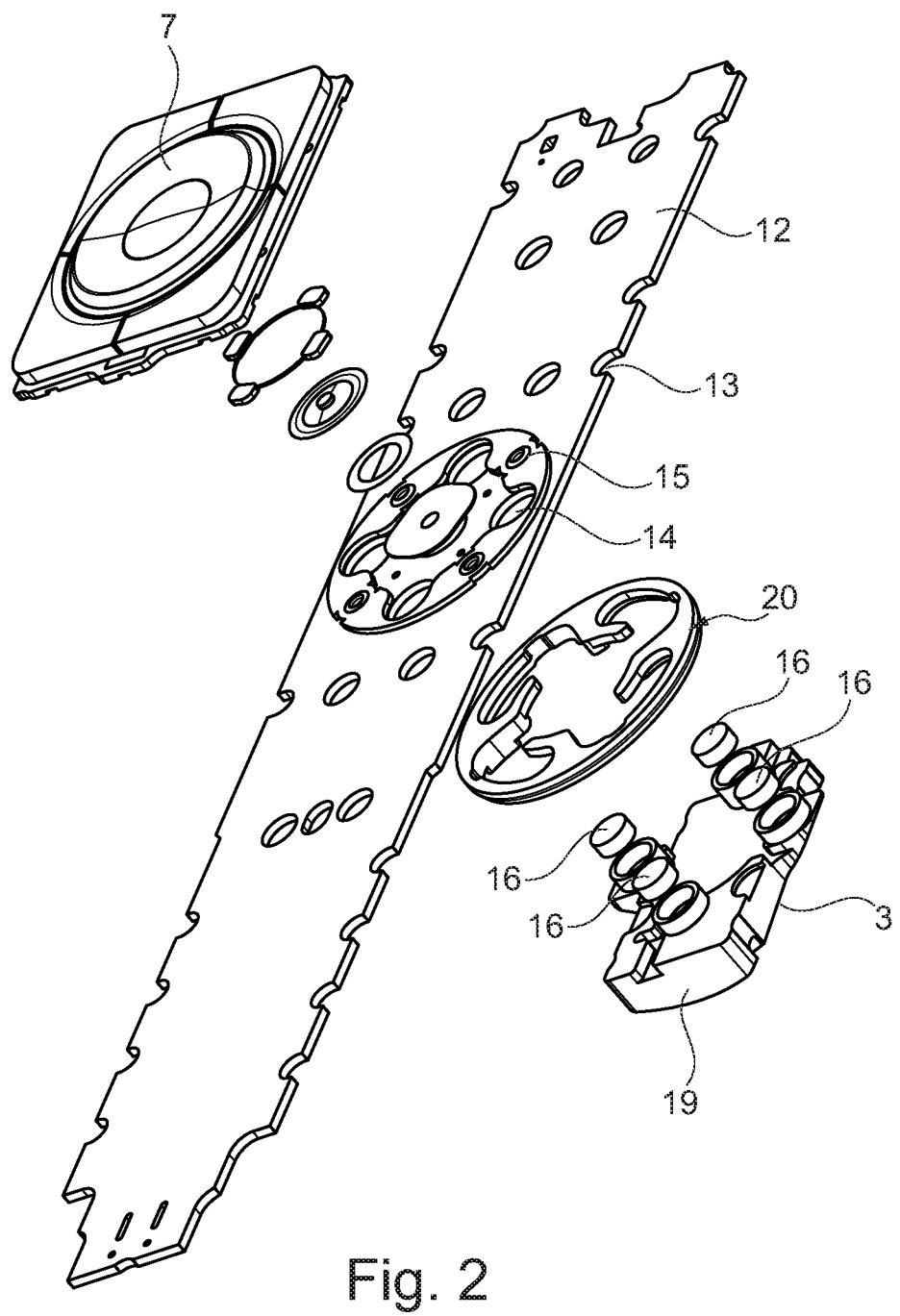
FIG. 2 is an exploded view of the essential parts of the invention when viewed in a first viewing direction without showing the other parts of the remote control.

The invention essentially relates to the guidance of the control ring 7 of the remote control 1 when the key areas 8, 9, 10 or 11 are pressed. FIGS. 2 and 3 show a circuit board 12 accommodating the essential electrical and electronic components, wherein they are not shown here for reasons of clarity.

The edges of the circuit board 12 have several recesses 13, which are used to position the circuit board 12 on assigned protrusions of the lower casing 3. In the area in which the control ring 7 is positioned, the circuit board 12 has two groups of openings 14 and 15, wherein a pair of magnets 16 and 17 is assigned to each opening 14, whereas the openings 15 are designed to receive the locking pins 18 which are attached to a yet-to-be-described guide disc or guide plate in the shape of a ring disc 29. Each pair of magnets 16 and 17 is part of a key activation sensor which is not provided with reference signs. As described in detail in DE 10 2016112318, each pair of magnets 16 and 17 has opposing poles, so that they generate mutually repulsing forces, wherein each key activation sensor is equipped with a magnet sensor (not shown) in the effective area of the magnets 16 and 17 which face each other. The magnets 17 are fixed to the control ring 7 and can only move together with it. The magnets 16 are also fixed to a holder 19 which may also be part of the lower casing 3. Only for the sake of simplification, the holder 19 is shown here as a separate component. The magnets 16 and 17 are assigned to each other in pairs, and their magnetic field extends through the openings 14 of the circuit board 12, wherein the distance between the assigned magnets 16 and 17 change when one of the areas 9 to 11 of the circuit board 12 is pressed, which can be detected by the sensors (not shown), and which can be evaluated by an electronic evaluation circuit (also not shown) which is part of each key activation sensor to trigger commands emitted by the remote control 1.

Figure 4:
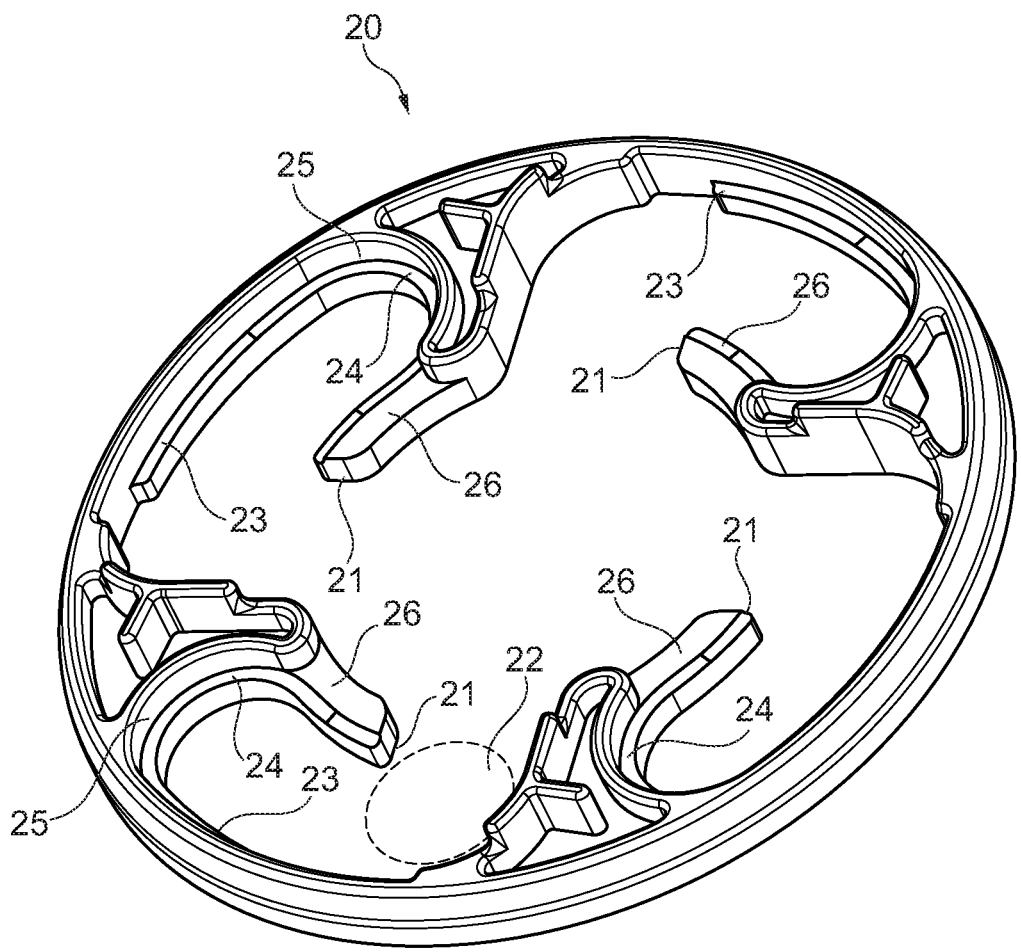
FIG. 4 is a diagram of a locking ring used in this invention

The locking pins 18 reach through the openings 15 of the circuit board 12 from the side of the control ring 7, and with their field of action reach a locking ring 20 which is arranged on the opposite side of the circuit board 12 and supported by it. This locking ring 20 is shown in detail in FIG. 4 and is described in connection with the locking pins 18.

The locking ring 20 has a flat underside with which it lies on the underside of the circuit board 12. The outer contour of the locking ring 20 has a circular shape here. Inside, the locking ring 20 is equipped with a number of stepped arms 21 corresponding to the number of locking pins 18, which are approximately u-shaped, bent to form segments of a circle in the centre, and aligned circumferentially. Between two adjacent arms 21 there is a dashed entrance area 22 which is adjusted to the diameter of the locking pins 18. Following this entrance area 22, chamfers 23 rising in the circumferential direction are arranged radially opposite to each arm 21 and extending into an approximately semi-circular area 24 of constant height, wherein this area is followed axially upwards by a second semi-circular area 25 which is approximately the height of the outer contour of the locking ring 20. Each semi-circular area 24 is followed by a retaining arm element 26 which is slightly tilted in radial direction towards the outer surface of the locking ring 20, and thus forms a narrowing for the locking pins 18, thus providing a hold for the locking ring 20 onto each locking pin 18. The holding arm 26 is resilient due to the material properties of the locking ring 20. In this way, the locking pins 18 and the locking ring 20 are fixed to one another.

Figure 5:
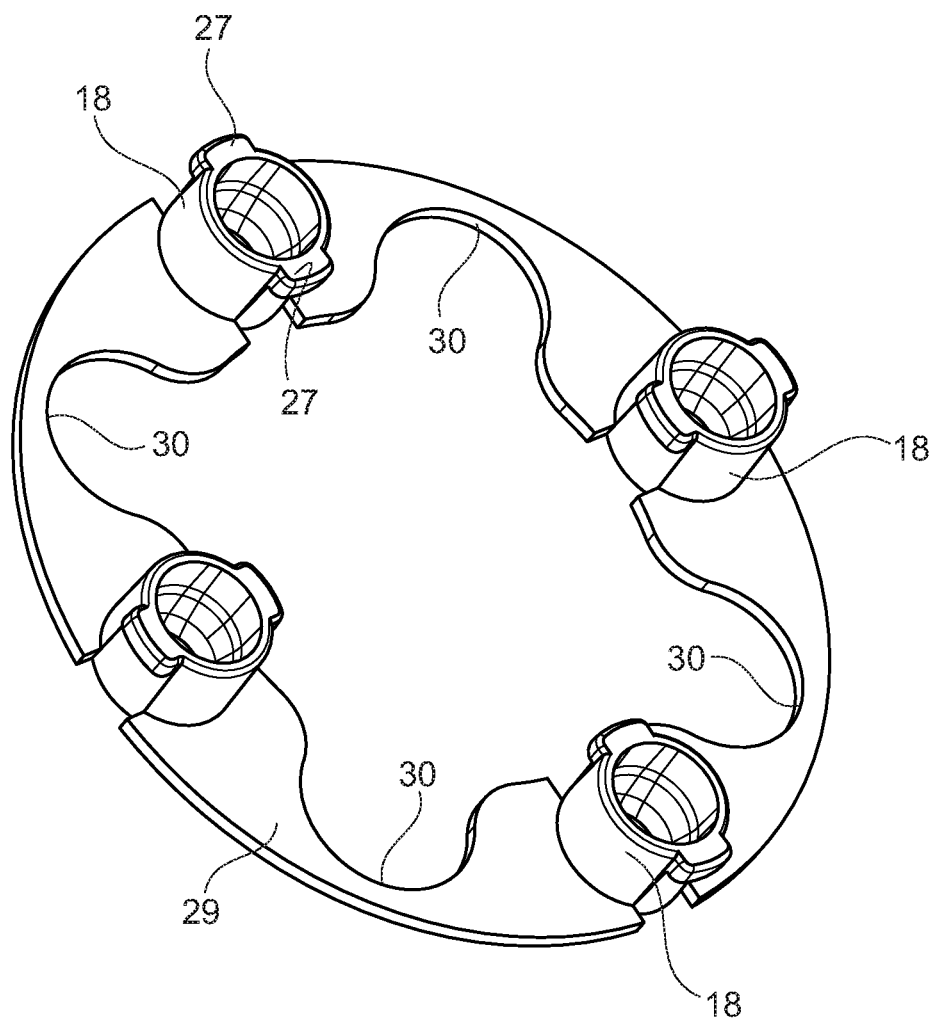
FIG. 5 is a diagram of the locking pins used in this invention.

The locking pins 18 are displayed in FIG. 5. They are fixed together at the above mentioned ring disc 29 or even combined with the ring disc 29 to form one piece. This clearly establishes their alignment in terms of the entrance areas 22. They have a cylindrical contour and a thickened head area, comprising radially protruding locking protrusions 27 over a certain circumference. These locking protrusions 27 extend towards the inside and outside at least in radial direction of the ring disc 29. The locking protrusions 27 of the completely mounted locking ring 20 are supported at least section-wise by the semi-circular area 24, wherein the inner wall of the locking ring 20 supports radial outer surfaces of the locking protrusions 27 which may thus provide guidance. The locking protrusions 27 extend only over a limited circumference range. Accordingly, the openings 15 of the circuit board 12 also have appropriately adapted opening areas, which are circular and which are joined by radial widening areas according to the locking protrusions 27.

The locking protrusions 27 on each locking pin 18 are offset against each other in the circumferential direction by 180° due to the above-mentioned radial alignment of the ring disc 29.

As can be seen best in FIGS. 3 and 5, the locking pins 18 are attached to the ring disc 29, which also provides a clear definition for the position of the locking protrusions 27. Here the ring disc 29 is circular and has recesses 30 on the inside to arrange the magnets 17, so that this ring disc 29 and thus also the locking pins 18 are always clearly positioned and aligned.

On assembly, in addition to the other components, the control ring 7 with the magnet 17 attached to it and the locking pins 18 which are also attached to it by means of the ring disc 29, are positioned on the top side of the circuit board 12, so that the magnets 17 are located in the area of the openings 14, while the locking pins 18 of the ring disc 29 reach through the openings 15 to such an extent that the area of the locking pins 18 adjoining the locking protrusions 27 protrudes over the underside of the circuit board 12. The ring disc 29 is thus evenly supported by the circuit board 12. With the ring disc 29 inserted in this way, the locking ring 20 can be positioned on the opposite side of the circuit board 12, so that in the beginning the locking pins 18 lie in the entrance area 22, wherein the radially projecting locking protrusions 27 of the locking pins 18 slide along the chamfer 23 when the locking ring 20 is turned until they reach the area 24, which then causes the locking ring 20 to be fixed and the ring disc 29 to be retained. In this inserting process, the retaining arms 26 are sprung slightly towards the centre of the locking ring 20 and then sprung back again in the direction of their starting position if the locking pins 18 have reached their final position, i.e. they reached the second semi-circular area 25. Now the control ring 7 and the locking ring 20 are properly fixed to the circuit board 12.

It is object of the ring disc 29 being fixed to the circuit board 12 in such a way, when viewed from the rotation axis of the ring disc 29, to prevent a radial movement of the key areas 8, 9, 10 and 11 of the control ring 7 in the inward and outward direction. In this way, the key areas 8, 9, 10 and 11 are guided in axial direction, so that they can only be moved towards and back from the circuit board 12 in order to ensure that the above-mentioned detection of pressing down the key areas 8, 9, 10 and 11 can be carried out without measurement errors when the magnets 16 and 17 are brought together and separated. This also prevents rubbing of the control ring 7 on the upper casing 2.

Compared to other fastening methods of the ring disc 29 on the circuit board 12, such as gluing, screwing, latching etc., the solution described above is durable, cost-effective and easy to install.

To improve the previously mentioned axial guidance of the key areas 8, 9, 10 and 11 of the control ring 7, the locking pins 18 are of hollow cylindrical design and axially open towards the control ring 7. On one side of the key areas 8, 9, 10 and 11 of the control ring 7 facing the circuit board 12, guide posts 31 are executed which engage axially in the hollow cylindrical locking pins 18.

The invention claimed is:

1. Remote control comprising:
   a circuit board having a first side and a second side opposite the first side;
   a control ring on the first side of the circuit board, wherein the control ring comprises pressable key areas assigned to key activation sensors;
   a guide disc on the first side of the circuit board;
   locking pins protruding from the guide disc and guided from the first side of the circuit board through openings of the circuit board to the second side of the circuit board, wherein the locking pins are cylinders with axially aligned openings;
   radial locking protrusions on the guide disc locking pins;
   a locking ring on the second side of the circuit board, wherein the locking ring comprises recesses on which the locking protrusions of the locking pins on the guide disc engage;
   wherein the locking ring recesses have a chamfer which bears the locking protrusions of the guide disc locking pins upon turning the locking ring, which turning fixes the locking ring which holds the guide disc; and
   wherein the control ring comprises cylindrical posts engaged into the axially aligned openings of the guide disc locking pins.

2. Remote control as claimed in claim 1, characterised in that the radial locking protrusions extend over a limited circumference of the locking pins.

3. Remote control as claimed in claim 2, characterised in that two radial locking protrusions are provided on each locking pin, with central axes of the locking protrusions offset by 180° from each other.

4. Remote control as claimed in claim 1, characterised in that the locking ring is circular and has an approximately u-shaped guiding element for each locking pin, into which an assigned locking pin engages and uses its radial locking protrusions to fix the locking ring to the circuit board with the guide disc.

5. Remote control as claimed in claim 4, characterised in that the u-shaped guiding element of the locking ring has a chamfer, on which an assigned locking protrusion of the locking pins engages.

6. Remote control as claimed in claim 1, characterised in that there are four locking pins on the guide disc which are offset by 90° at the circumference of the guide disc.

7. Remote control as claimed in claim 4, characterised in that one leg of the u-shaped guiding element is resiliently pre-stressed in the direction of the outer circumference of the locking ring.

8. Remote control as claimed in claim 2 wherein the openings in the circuit board are circular with widened areas to receive the locking pins and radial protrusions thereon.

9. Remote control as claimed in claim 1, characterised in that the locking pins are hollow and cylindrical, into which the cylindrical guide posts of the control ring engage.

10. Remote control of claim 1 wherein:
    the locking ring is circular and has an approximately u-shaped guiding element for each locking pin, into which an assigned locking pin engages and uses its radial locking protrusions to fix the locking ring to the circuit board with the guide disc; and
    the u-shaped guiding element of the locking ring has said chamfer, on which an assigned locking protrusion of the locking pins engages.

11. Remote control of claim 1 wherein:
    the locking ring is circular and has an approximately u-shaped guiding element for each locking pin, into which an assigned locking pin engages and uses its radial locking protrusions to fix the locking ring to the circuit board with the guide disc;
    the u-shaped guiding element of the locking ring has said chamfer, on which an assigned locking protrusion of the locking pins engages; and
    the u-shaped guiding element is resiliently pre-stressed in the direction of the outer circumference of the locking ring.

12. Remote control of claim 2 wherein:
    the locking ring is circular and has an approximately u-shaped guiding element for each locking pin, into which an assigned locking pin engages and uses its radial locking protrusions to fix the locking ring to the circuit board with the guide disc; and
    the u-shaped guiding element of the locking ring has said chamfer, on which an assigned locking protrusion of the locking pins engages.

13. Remote control of claim 2 wherein:
    the locking ring is circular and has an approximately u-shaped guiding element for each locking pin, into which an assigned locking pin engages and uses its radial locking protrusions to fix the locking ring to the circuit board with the guide disc;
    the u-shaped guiding element of the locking ring has said chamfer, on which an assigned locking protrusion of the locking pins engages; and
    the u-shaped guiding element is resiliently pre-stressed in the direction of the outer circumference of the locking ring.

14. Remote control of claim 6 wherein:
    the locking ring is circular and has an approximately u-shaped guiding element for each locking pin, into which an assigned locking pin engages and uses its radial locking protrusions to fix the locking ring to the circuit board with the guide disc; and
    the u-shaped guiding element of the locking ring has a has said chamfer, on which an assigned locking protrusion of the locking pins engages.

15. Remote control of claim 6 wherein:
    the locking ring is circular and has an approximately u-shaped guiding element for each locking pin, into which an assigned locking pin engages and uses its radial locking protrusions to fix the locking ring to the circuit board with the guide disc;
    the u-shaped guiding element of the locking ring has a has said chamfer, on which an assigned locking protrusion of the locking pins engages; and
    the u-shaped guiding element is resiliently pre-stressed in the direction of the outer circumference of the locking ring.

16. Remote control of claim 1 wherein the chamfer rises in a circumferential direction.

17. Remote control of claim 1 wherein the guide disc is sandwiched between the control ring and the circuit board.

\* \* \* \* \*